United States Patent [19]

Marty et al.

[11] Patent Number: 4,920,256
[45] Date of Patent: Apr. 24, 1990

[54] UNIVERSAL ELECTRONIC PAYMENT TERMINAL BASE INCLUDING MEMORY CARD PROGRAMMING VOLTAGE BOOSTER

[75] Inventors: Jacques Marty; Jérome Tremblet, both of Bourg les Valence; Jean-Jacques Delorme, Valence, all of France

[73] Assignee: Crouzet, Paris, France

[21] Appl. No.: 162,541

[22] Filed: Mar. 1, 1988

[30] Foreign Application Priority Data

Mar. 2, 1987 [FR] France .................. 87 02788

[51] Int. Cl.$^5$ .............................. G06K 1/00
[52] U.S. Cl. ................................ 235/441; 235/492
[58] Field of Search ............... 235/380, 375, 492, 441, 235/487, 488; 364/492; 365/201, 189.01, 226; 307/465; 330/127, 137

[56] References Cited

U.S. PATENT DOCUMENTS

| 4,277,837 | 7/1981 | Stuckert ..................... 235/380 |
| 4,767,918 | 8/1988 | Kushima et al. ............. 235/492 |
| 4,767,920 | 8/1988 | Kitta et al. .................. 235/492 |
| 4,794,236 | 12/1988 | Kawana et al. .............. 235/441 |

FOREIGN PATENT DOCUMENTS

| 0202622 | 11/1979 | European Pat. Off. . |
| 2584211 | 5/1982 | France . |
| 2438289 | 2/1985 | France . |
| 61-59586 | 3/1986 | Japan . |
| 62-17863 | 1/1987 | Japan . |

OTHER PUBLICATIONS

B. McIvor: "Use of EEPROM Technology in Smart Card", Electro and Mini/Micro, Northeast (N.Y., Apr. 23-25, 1985).
Hunt, "Programmer Power Supply", *Electronics & Wireless World*, vol. 91, No. 1594 (Aug. 1985).
S. Hageman, "DC/dc Converter Powers EEPROMs": *Electrical Design News*, vol. 28, No. 2 (Jan. 1983).
"l'electronique de puissance les fonctions de base et leurs principales applications", by Guy Sequier.
"Integrated Electronis Analog and Digital Circuits and Systems", by Jacob Millman and Christos Halkias.

*Primary Examiner*—Aristotelis M. Psitos
*Assistant Examiner*—Robert A. Weinhardt
*Attorney, Agent, or Firm*—Lowe, Price, LeBlanc, Becker & Shur

[57] ABSTRACT

A universal electronic payment terminal base comprising an application and transaction microprocessor (4), with its power supply source (8) and being capable of receiving information identifying memory card holders, and a reader (6) of these cards controlled by the microprocessor (4). The source (8) also serves for programming the cards and delivers a voltage at most equal to the smallest of the programming voltages required. Between the low weight source (8) and the reader (6) a voltage booster (51) is provided for boosting the voltage to a constant level higher than the largest of the programming voltages, and a step by step voltage dropper (53) controlled by a variable cyclic ratio pulse generator (36).

8 Claims, 3 Drawing Sheets

UNIVERSAL ELECTRONIC PAYMENT TERMINAL BASE INCLUDING MEMORY CARD PROGRAMMING VOLTAGE BOOSTER

The present invention relates to a base for an electronic memory card payment terminal, the base comprising at least a microprocessor, an electric supply source for the microprocessor, means for memorizing an application program and a transaction program, connected to the microprocessor, means for the reception by the microprocessor of customer identification information, a memory card reader driven by the microprocessor, and a voltage source for programming the memory cards, formed by the electric supply source, and delivering a voltage at most equal to the smallest of the programming voltages required, a voltage booster being provided between said source and the card reader.

An electronic payment terminal is an apparatus making possible monitoring or banking transactions, via a banking system, between a tradesman and his customers on the very site of the sales; in other words, by means of such a terminal, the bank accounts of the purchasing customers are automatically debited and those of the selling tradesman automatically credited.

An electronic payment terminal may generally process one of the conventional means of payment formed by cheques, conventional magnetic cards and memory cards, or a combination thereof. The terminal base of the invention is adapted for processing at least memory cards without conventional magnetic cards and cheques being excluded from its processing. Moreover, a cheque reader-editor will often be associated therewith.

By memory cards should be understood not only those of the customers, but also that of the tradesman concerned and which is permanently left in the apparatus, at least during opening hours, the card of the tradesman is called "tradesman security card". A memory card is a card on which a "chip" is fixed integrating a microprocessor and means for memorizing data programs.

The transaction program mentioned above, in fact contains the list of the holders of debtor accounts and forbidden accounts and of lost and stolen cards. This is the black list.

Four methods of working an electronic payment terminal may be contemplated. The terminal may stand alone and be connected directly to a banking system. It may be connected to a videotext apparatus of the Minitel kind which is connected to a banking system. It may be connected to a concentrator, i.e. to a local network controlling several terminals and which is connected to a banking system. In this case, we speak of a concentrated terminal. Finally, the terminal may be associated with a cash register, and therefore be one of its peripherals, the cash register being integrated in a local concentration network.

No electronic payment terminals exist up to present capable of being worked equally well in one or other of these four modes.

The present invention aims then at solving this first problem, by proposing a modular and evolutive solution based on the universal base, which may be used whatever the method of working, provided that some quite minor adaptations are made. With this base may be associated peripheral equipment, such for example as the cheque reader-editor already mentioned, or a keyboard for customers to enter their personal identification number (pin pad) connected to the corresponding reception means of the microprocessor.

The adaptations to be made in changing the working mode will essentially consist in substituting, for a program of application of the memory means of the microprocessor, another which will correspond to the working mode considered.

Besides these first results, the present invention aims at providing another: making the payment terminals and so the universal base of the invention portable. This second problem of portability, in connection with the first one concerning modularity, that is to say the general problem of forming a universal base for modular electronic payment terminals with different respective applications and portable at will, finds its solution at the level of the electric power supply for the memory cards.

The memory card must be subjected to a supply voltage as well as to a programming voltage. According to certain standards in force, and which will be considered here for the sake of the cause, the programming voltage for the memory card must be discretely variable from 5 V to 25 V, with steps of 0.1 V.

Up to now, a 30 V battery has been used for this purpose and, by means of a D-A converter driven by the microprocessor, the voltage of $(5+0.1p)V$ was generated. It will be readily understood that the weight of a 30 V battery is irreconcilable with the desired portable character.

From the document "Electrics and Wireless World, Vol 91, n° 1594, August 1985, p. 64, London, GB; Programmer Power Supply" a system is already known similar to that of the base of the above mentioned type. But this system proposes two controls for obtaining four different voltages and modifying it in order to obtain a programming voltage varying by steps of 0.1 V would require 8 controls. What would be gained at the level of the power supply source would therefore be partially lost at the level of these controls. Furthermore, the system described in this document does not at the same time provide switching times from the quiescent voltage to the programming voltage for the cards which are both short and accurate. And thus the applicant proposes his invention.

The present invention relates then to a base of the above mentioned type, chracterized by the fact that the programming voltage for the memory cards is controlled by a pulse generator with variable cyclic ratio.

Under these conditions, the programming voltage source, which is the electric power supply source of the microprocessor, preferably a battery, of the base of the invention is of low weight. In addition, it may deliver the general power supply for the cards.

Advantageously, the voltage booster is a step by step booster controlled by the variable cyclic ratio pulse generator, preferably integrated with a microprocessor.

However, even more advantageously, the voltage booster is adapted for boosting the voltage of the voltage source to a constant level slightly higher than the largest of the programming voltages required and the base comprises, between the booster and the card reader, a step by step voltage dropper controlled by the variable cyclic ratio pulse generator integrated with the microprocessor.

In fact, although the transfer function of a step by step voltage booster is of the exponential type, which for high output voltages is not satisfactory from the accuracy point of view, the transfer function of a step by step dropper is on the contrary of the linear type.

To sum up, it is because of the interface between the microprocessor and the card reader, of the base of the invention, comprising more particularly the variable cyclic ratio pulse generator as sole control and the voltage booster, as well as the low weight voltage source or only that of the microprocessor, that the applicant may propose modular electronic payment terminals which are portable and have the desired accuracy for processing memory cards.

The invention will be better understood from the following description of two of its embodiments, with reference to the accompanying drawings in which.

Figure 1:
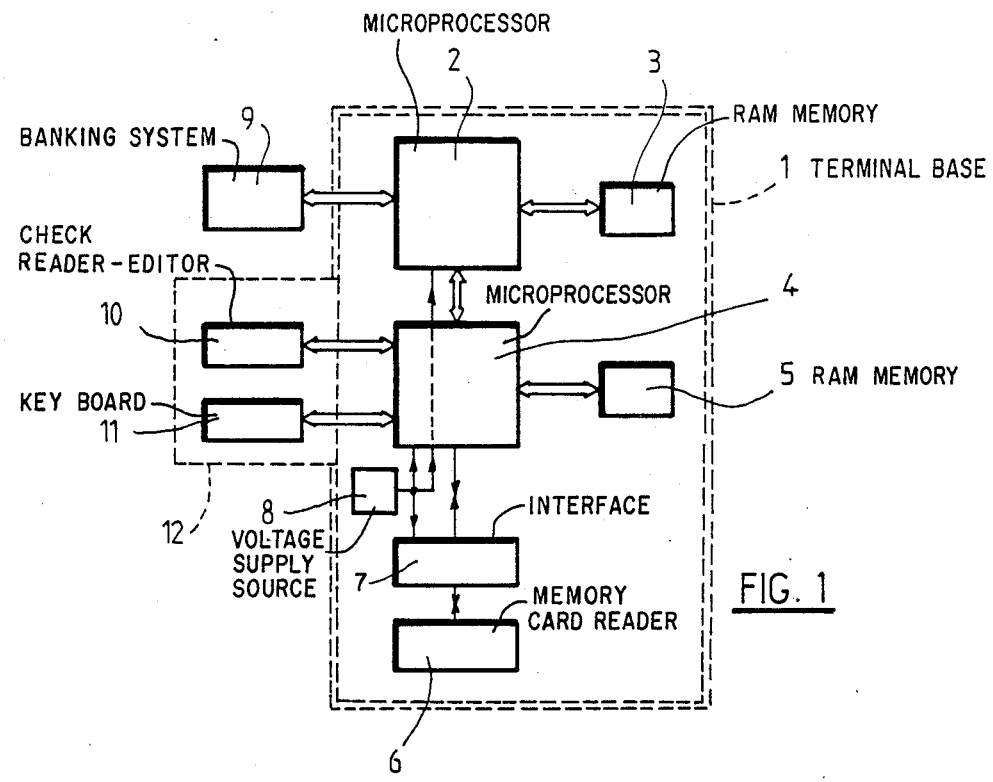
FIG. 1 is a block diagram illustrating an electronic payment terminal incorporating the base of the invention.

Referring to FIG. 1, the electronic payment terminal base 1 comprises a first microprocessor 2 connected by a parallel bus to a RAM 3 which is preprogrammed as a function of one of the applications of the terminal analysed above, a second microprocessor 4 connected by a series bus to the first microprocessor 2, and by a parallel bus to another RAM 5 preprogrammed with the transaction program also analyszed above, a memory card reader 6, for reading the tradesman's card CSC and customer's card CAM, connected to the transaction microprocessor 4 by an interface 7, and a voltage supply source 8 connected to the microprocessors 2, 4 and to the interface 7.

By a series bus, the application microprocessor 2 is connected to the application system 9, namely the banking system directly if the terminal is standing alone or to a videotext apparatus or to a concentration network or to a cash register. The transaction microprocessor 4 driving the reader is here connected by a series bus to a cheque reader-editor 10 and, by an appropriate receiver, in this case conventional and still by means of a series bus, to a keyboard 11 for entering personal identification numbers and completing base 1 so as to form the terminal 12 properly speaking.

It will be noted that, in the example considered, although two microprocessors are provided for processing the data of the two memories 3, 5, respectively, a single one of these microprocessors could also perform the double function. Similarly, the application and transaction programs could be contained in a single RAM.

Figure 2:
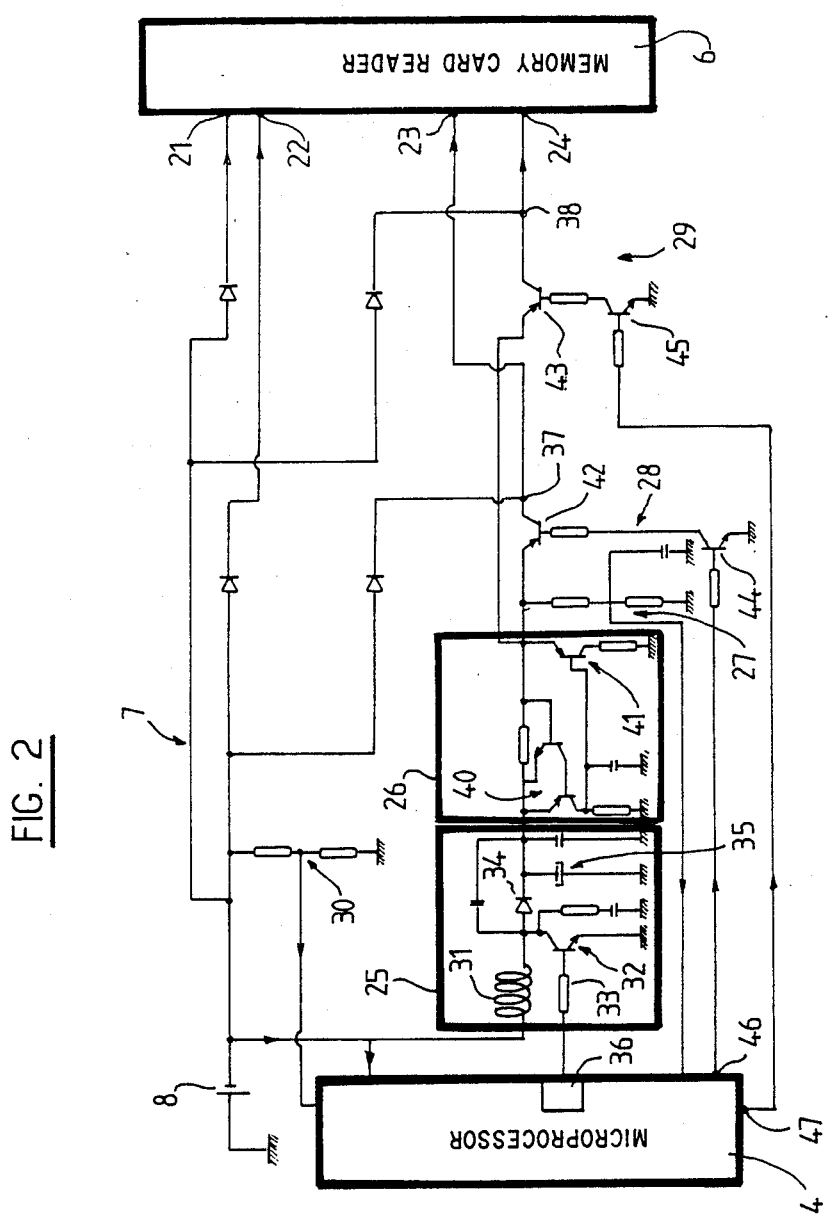
FIG. 2 is a detailed electronic diagram of the first embodiment of the interface, between the microprocessor driving the card reader and the reader, of the base of the invention.

FIG. 2 shows the interface, in its first embodiment, between the control microprocessor 4 and the card reader 6.

A battery 8, here of 5 V, feeds the microprocessor 4 with electric power and is connected, by diodes, to four inputs 21, 22, 23, 24 of the card reader 6 for respectively supplying with electric power the tradesman's card CSC, the customers' cards CAM and for delivering a quiescent programming voltage, here of 5 V, to the card CAM and to the cards CSC. The 5 V voltage from batery 8 is the smallest programming voltage required.

The interface 7 includes a step by step voltage booster 25, a current regulator 26 at the output of the booster, a first measuring bridge 27, a circuit 28 for controlling the programming voltage for the cards CAM and a circuit 29 for controlling the voltage for programming card CSC, in parallel across the output of the current regulator 26, and a second measuring bridge 30.

The voltage booster 25 essentially comprises an induction coil 31 connected to source 8, a transistor 32 controlled by its base by a variable cyclic ratio pulse generator 36 of the microprocessor 4, through a resistor 33, a diode 34 connected to coil 31 and to the collector of transistor 32 and a capacitor connected to the cathode of the diode 34.

This voltage booster 25 is adapted so as to deliver, from the voltage source 8, here 5 V, as a function of the control of transistor 32, this source voltage increased by voltage steps, here of 0.1 V, so that the voltages for programming the cards CAM and CSC, at 23 and 24, may vary step by step here from 5 V to 25 V. It will be noted that the outputs 37 and 38 of circuits 28 and 29 controlling the programming voltages for card CAM and CSC are connected to the voltage source 8. These connections are however made through diodes which are provided in fact so that the voltages are not added together at these connection points when these control circuits are themselves delivering voltages, by construction, higher than that of the source.

Such as taught on pages 209-211 of the work "L"/électronique de puissance, les fonctions de base et leurs principales applications", by Guy S/éguier, published in 1979 by Dunod, and $V_i$ being the input voltage of the booster, i.e. that of the source 8, $V_o$ the output voltage of the booster and r the cyclic ratio of the pulses of generator 36, the transfer function of the voltage booster 25 is of the form $$V_o = \frac{V_i}{1 - r}$$

For r=O, the programming voltage is the quiescent voltage delivered directly by the source 8. For r=0.8, to take the practical example considered, the programming voltage is equal to 25 V.

The current regulator 26, connected to the output of the voltage booster essentially comprises a current measuring circuit 40 and an output transistor 41. The function of this regulator is to make sure that the load current for the voltage booster 25 remains constant, whatever its output voltage and the consumption of the memory cards, so that this output voltage is delivered with the best possible accuracy.

The measuring bridge 27 between the output of the current regulator 26 and the microprocessor 4 is provided for determining the output voltage of the voltage booster and possibly correcting it by adjusting the pulse generator 36.

The control circuits 28, 29 each comprise essentially two series transistors, one of which 42, 43 behaves as a switch controlled by the other 44, 45 to which is applied the signal for controlling the programming voltage of the cards CAM, CSC, delivered by the microprocessor at 46, 47 and which therefore allow rapid switching from the non operating voltage to the programming voltage and conversely. The measuring bridge 30, between source 8 and microprocessor 4, is provided for checking that the value of the supply voltage applied at 20, 22 to the cards is correct.

Figure 4:
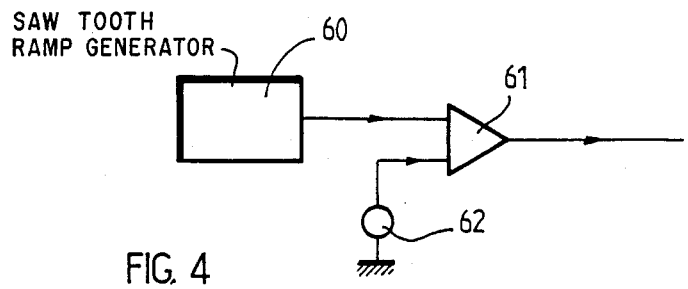
FIG. 4 is a diagram of the variable cyclic ratio pulse generator of the base of the invention.

The variable cyclic ratio pulse generator 36 is integrated in the microprocessor 4. From the functional point of view, it may be represented by the diagram of FIG. 4. It comprises a saw tooth ramp generator 60, connected to one of the inputs of comparator 61, whose other input receives the signal from a reference voltage generator 62. The output signal of the comparator is a succession of rectangular pulses with variable cyclic ratio, the ratio depending on the level of the reference voltage.

Figure 3:
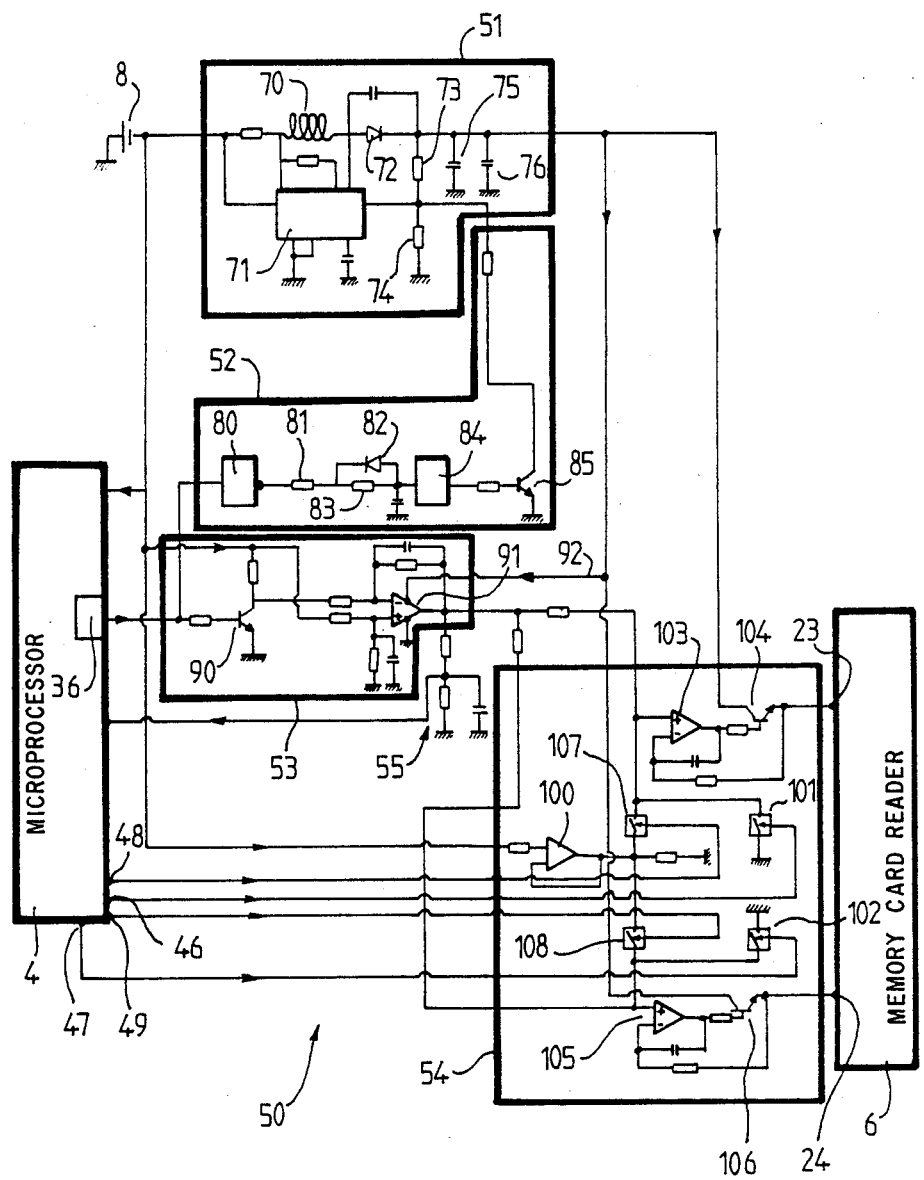
FIG. 3 is a detailed electronic diagram of a preferred variant of the microprocessor-reader interface of the base of the invention.

FIG. 3 shows the interface, in its second embodiment, between the control microprocessor 4 and the card reader 6, without its circuits for supplying the cards CAM and CSC with electric power and which are substantially organized like those of the interface 7 shown in FIG. 2. Interface 50 of FIG. 3 comprises a voltage booster 51, for boosting the voltage of source 8, to a constant level, here 30 V, a circuit 52 for controlling the booster 51 itself controlled by the variable cyclic ratio pulse generator 36 so that the voltage delivered by the voltage booster 31 is effectively that for which it is provided, here 30 V, when the ratio r is not zero, and so that the voltage delivered is a non operating voltage, here 8 V when r is zero, i.e. when generator 36 does not deliver pulses.

The interface 50 also comprises, at the output of the voltage booster 51, a step by step voltage dropper 53 controlled by generator 36. The voltages for programming the cards are delivered at 23, 24, through a current amplifying circuit 54 connected to the output of the voltage dropper 53 and supplied by the voltage booster 51, these programming voltages being controlled as in the interface 7, by microprocessor 4 from its terminals 46, 47. As in the interface 7, a measuring bridge 55 is also provided in interface 50 and is similar to the other one so as to be able if required to correct the output voltage of the voltage dropper.

The voltage booster 51 comprises essentially an induction coil 70 connected to source 8, through a resistor, and to an integrated circuit 71, a diode 72 and a resistor bridge 73, 74 and two capacitors 75, 76 connected to the cathode of diode 72. Circuit 71, which provides the booster function, here comprises essentially a chopped power supply control.

Circuit 52 for controlling the voltage booster comprises essentially, in series, an integrated circuit 80 connected to the generator 36, a resistor 81, a diode 82 and a resistor 83 in parallel, another integrated circuit 84 and a transistor 85 whose collector is connected to the voltage booster 51. The integrated circuits 80, 84 provide here inverter functions.

The step by step voltage dropper 53 comprises essentially a transistor 90, fed at its collector by source 8 and controlled at its base by the generator 36, and an operational amplifier 91 connected by its negative input to the collector of the transistor 90 and by its positive input to source 8 and is supplied by the output of the voltage booster 51 on line 92. This voltage dropper 53 is adapted so as to provide, from the output voltage of the voltage booster 51, here 30 V, and depending on the control of transistor 90, this output voltage of the voltage booster reduced by voltage steps, here of 0.1 V, so that the voltages for programming the cards CAM and CSC, at 22 and 24, may vary step by step, here from 25 V to 5 V.

As taught on pages 540, 541, 543, 544 of the work "Integrated Electronics Analog and Digital Circuits and Systems", by Jacob Millman and Christos Halkias, published in 1972 in the International Student publications of Mc. Grawhill and $V_{dc}$ being the output voltage of the voltage dropper and r the cyclic ratio of the pulses of generator 36, the transfer function of the voltage dropper is of the form $$V_{dc} = k \, r$$

For r=0, the programming voltage is the non operating voltage of 8 V provided via two switches 107, 108, respectively for cards CAM and cards CSC, controlled by the microprocessor 4 at 48, 49. These switches make it possible to switch rapidly from the non operating voltage to the programming voltage, and conversely.

Contrary to the transfer function of the voltage booster 25 of interface 7, that of the voltage dropper of interface 50 is linear, which offers the advantage of good accuracy over the whole range of variation of the cyclic ratio of the control pulses of generator 36.

The current amplifying circuit 54 comprises essentially an operational amplifier 100, fed at its positive terminal by source 8, and connected to a circuit CAM, controlled by a switch 101 and to a circuit CSC controlled by a switch 102. The circuit CAM essentially comprises an operational amplifier 103, connected by its positive terminal to the output of the voltage dropper 53 and a transistor 104, connected by its base to the output of amplifier 103, by its collector to the output of voltage booster 51 and by its emitter to the input for the programming voltage of cards CAM 23 of reader 6. Similarly, the circuit CSC of the amplifier 54 includes an operational amplifier 105 and a transistor 106 arranged in the same way as those of circuit CAM, the emitter of transistor 106 being connected to the input 24 for programming the card CSC of reader 6.

We claim:
1. A base for an electronic memory card payment terminal, said base comprising a microprocessor connectable to an electric supply source, memory means for storing an application program and a transaction program, said memory means connected to said microprocessor, receiving means included in said microprocessor for the reception of customer identification information, a memory card reader driven by said microprocessor, and a voltage source for programming memory cards, said voltage source being derived from said electric supply source and being variable to meet various programming voltage requirements, said electric supply source being no greater than the smallest of the programming voltages required, said voltage source comprising a voltage booster circuit provided between said electric supply source and said memory card reader and a variable cyclic ratio pulse generator circuit for controlling said voltage booster circuit.

2. The terminal base according to claim 1, wherein the voltage booster is a step by step voltage booster controlled by the variable cyclic ratio pulse generator.

3. The terminal base according to claim 2, wherein a current regulator is connected to the output of the voltage booster.

4. The terminal base according to claim 2, wherein said electric supply source is connected to programing inputs of the memory card reader via diodes so as to provide quiescent programming voltages.

5. The terminal base according to claim 1, wherein the voltage booster is adapted so as to boost the voltage of said voltage source to a constant level higher than the largest of the programming voltages required and a step by step voltage dropper controlled by the variable cyclic ratio pulse generator, is connected to the output of the voltage booster.

6. The terminal base according to claim 5, wherein the voltage booster is controlled by a circuit, controlled by the variable cyclic ratio pulse generator and adapted so that, when the cyclic ratio is zero, the voltage booster delivers a quiescent voltage output.

7. The terminal base according to claim 5, wherein a current amplifying circuit is connected to the output of the voltage dropper and is fed by the voltage booster.

8. The terminal base according to claim 1, wherein switches are provided, controlled by the microprocessor, for switching the voltage applied to said memory card reader between a quiescent voltage and a memory card programming voltage.

* * * * *